(12) United States Patent
Liu

(10) Patent No.: US 11,121,313 B2
(45) Date of Patent: Sep. 14, 2021

(54) SEMICONDUCTOR STRUCTURE AND FORMATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Huan Liu, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 0 days.

(21) Appl. No.: 16/862,969

(22) Filed: Apr. 30, 2020

(65) Prior Publication Data
US 2021/0202831 A1 Jul. 1, 2021

(30) Foreign Application Priority Data
Dec. 27, 2019 (CN) .......................... 201911380367.X

(51) Int. Cl.
*H01L 43/12* (2006.01)
(52) U.S. Cl.
CPC .................................. *H01L 43/12* (2013.01)
(58) Field of Classification Search
None
See application file for complete search history.

(56) References Cited

U.S. PATENT DOCUMENTS

| | | | | |
|---|---|---|---|---|
| 9,214,333 | B1* | 12/2015 | Sims | .................... H01L 21/0217 |
| 10,672,979 | B1* | 6/2020 | Shih | ......................... H01L 43/08 |
| 2010/0207214 | A1* | 8/2010 | Chuang | ............. H01L 21/823814 257/369 |
| 2013/0020677 | A1* | 1/2013 | Su | ......................... H01L 27/0805 257/532 |
| 2014/0264296 | A1* | 9/2014 | Choi | ......................... H01L 33/56 257/40 |
| 2015/0076669 | A1* | 3/2015 | Chang | ................ H01L 21/76829 257/635 |

* cited by examiner

Primary Examiner — Mounir S Amer

(57) ABSTRACT

A semiconductor structure and a formation method thereof are disclosed. The formation method includes: providing a base; forming a dielectric layer on the base; forming a conductive via running through the dielectric layer; forming a conductive plug in the conductive via; forming a protective layer on the dielectric layer, wherein the protective layer covers the conductive plug; forming an aligner trench in the protective layer and the dielectric layer, wherein the aligner trench is isolated from the conductive plug; after forming the aligner trench, removing the protective layer to expose a top portion of the conductive plug; and after removing the protective layer, forming a magnetic tunnel junction (MTJ) laminated structure on the conductive plug. The protective layer formed in embodiments and implementations of the present disclosure may play a role of protecting the conductive plug, so as to prevent formation of metal oxide caused by oxidization of the conductive plug, which is then conducive to enabling the MTJ laminated structure and the conductive plug, correspondingly improving contact performance of the MTJ laminated structure and the conductive plug, and further improving performance of a magnetic random access memory (MRAM) device.

14 Claims, 8 Drawing Sheets

SEMICONDUCTOR STRUCTURE AND FORMATION METHOD THEREOF

RELATED APPLICATIONS

The present application claims priority to Chinese Patent Appln. No. 201911380367.X, filed Dec. 27, 2019, the entire disclosure of which is hereby incorporated by reference.

BACKGROUND

Technical Field

Embodiments and implementations of the present disclosure relate to the field of semiconductor manufacturing, and in particular to a semiconductor structure and a formation method thereof.

Related Art

A magnetic random access memory (MRAM) is a nonvolatile magnetic random access memory. The MRAM device has high-speed read-write capability of a static random access memory (SRAM), and high integration degree of a dynamic random access memory (DRAM), that can be repeatedly written for an unlimited number of times. The MRAM device is a "full kinetic energy" solid-state memory. Therefore, the MRAM device has a very promising application prospect, and is expected to dominate the market of next-generation memories.

In the MRAM device, data is stored by a magnetic state of a storage element. An MRAM unit usually includes a transistor and a magnetic tunnel junction (MTJ) that jointly form one storage unit. The MTJ structure includes at least two electromagnetic layers and an insulation layer for isolating the two electromagnetic layers. The two electromagnetic layers can maintain two magnetic polarization fields separated by the insulation layer. One of the magnetic polarization fields is a fixed magnetic layer having a fixed polarization direction, and the other magnetic polarization field is a free-rotating magnetic layer having a polarization direction that can change with changes of an external field. When the polarization directions of the two electromagnetic layers are parallel, the tunneling current flowing through the MTJ structure has a maximum value, and the resistance of the MTJ structure unit is relative low. When the polarization directions of the two magnetic layers are anti-parallel, the tunneling current flowing through the MTJ structure has a minimum value, and the resistance of the MTJ structure unit is relative high. Information is read by measuring the resistance of the MRAM unit, which is the working principle of the MTJ structure.

In addition, in order to be compatible with various processes of manufacturing a complementary metal oxide semiconductor (CMOS) integrated circuit, the MTJ is generally inserted between two metal layers of the CMOS integrated circuit, such as between a first metal layer and a second metal layer. The two metal layers are electrically connected through a conductive via interconnection structure.

SUMMARY

Embodiments and implementations of the present disclosure provide a semiconductor structure and a formation method thereof, that improves performance of a magnetic random access memory (MRAM) device.

In one aspect, embodiments and implementations of the present disclosure provide a formation method of a semiconductor structure. In one form, the method includes: providing a base; forming a dielectric layer on the base; forming a conductive via running through the dielectric layer; forming a conductive plug in the conductive via; forming a protective layer on the dielectric layer, wherein the protective layer covers the conductive plug; forming an aligner trench in the protective layer and the dielectric layer, wherein the aligner trench is isolated from the conductive plug; after forming the aligner trench, removing the protective layer to expose a top portion of the conductive plug; and after removing the protective layer, forming a magnetic tunnel junction (MTJ) laminated structure on the conductive plug.

In another aspect, embodiments and implementations of the present disclosure further provide a semiconductor structure. In one form, the semiconductor structure includes: a base; a dielectric layer, located on the base; a conductive plug, running through the dielectric layer; a protective layer, located on the dielectric layer and covering the conductive plug; and an aligner trench, located in the dielectric layer and the protective layer and isolated from the conductive plug.

Compared with the prior art, the technical solutions of embodiments and implementations of the present disclosure have the following advantages:

In some implementations of the formation method of the semiconductor structure of the present disclosure, before forming the aligner trench, a protective layer is also formed on the conductive plug. The formation of the aligner trench generally includes a step of etching the dielectric layer by taking a mask layer as a mask and then removing the mask layer. And in the field of semiconductors, mask layers are usually removed by oxygen-containing gas. The protective layer formed in embodiments and implementations of the present disclosure can play a role of protecting the conductive plug during the removal of the mask layer to prevent being oxidized of the conductive plug due to exposure to the oxygen-containing atmosphere. Therefore, after the MTJ laminated structure is formed on the conductive plug, it is conducive to enabling the MTJ laminated structure to be in direct contact with the conductive plug, correspondingly conducive to reducing the contact resistance of the MTJ laminated structure and the conductive plug and improving the contact performance of the MTJ laminated structure and the conductive plug, thus favorably improving the performance of an MRAM device.

In some implementations, after forming the dielectric layer on the base, the formation method of the semiconductor structure further includes: forming an etching stop layer on the dielectric layer. In the subsequent removal of the protective layer, the protective layer and the etching stop layer have a relatively large etching selection ratio. The etching stop layer may define an etching stop position during the removal of the protective layer, which is conducive to preventing damage to the dielectric layer caused by a process of removing the protective layer, thus improving the top surface flatness and the height consistency of the dielectric layer, and then it is conducive to providing a flat interface with relatively high height consistency for the subsequent formation of the MTJ laminated structure. In addition, the formation of the conductive plug generally includes a planarization step. The etching stop layer may further define a stop position in the planarization step of forming the conductive plug, thereby being conducive to reducing the difficulty of the planarization and improving the top surface flatness and the height consistency of the conductive plug, so as to provide a good interface for the formation of the MTJ laminated structure.

DETAILED DESCRIPTION

Magnetic random access memory (MRAM) devices formed at present are poor in performance. Reasons for the poor performance of the MRAM devices are analyzed now in combination with a formation method of a semiconductor structure.

FIG. 1 to FIG. 7 illustrate schematic structure diagrams corresponding to various steps in one form of a formation method of a semiconductor structure.

Figure 1:
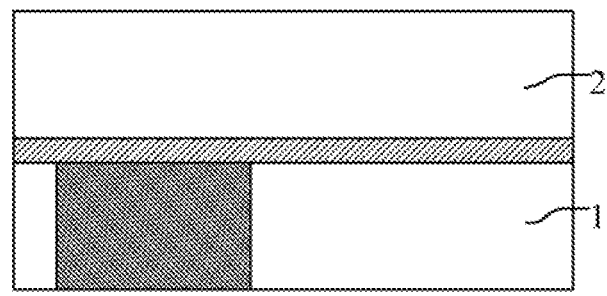
FIG. 1 to FIG. 7 are schematic structure diagrams corresponding to various steps in one form of a formation method of a semiconductor structure.

Referring to FIG. 1, a base 1 is provided, and a dielectric layer 2 is formed on the base 1.

Figure 2:
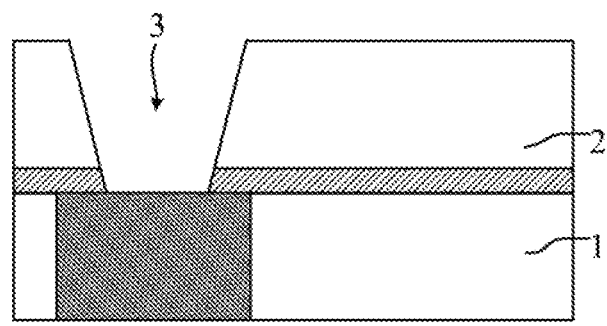

Referring to FIG. 2, a conductive via 3 running through the dielectric layer 2 is formed.

Figure 3:
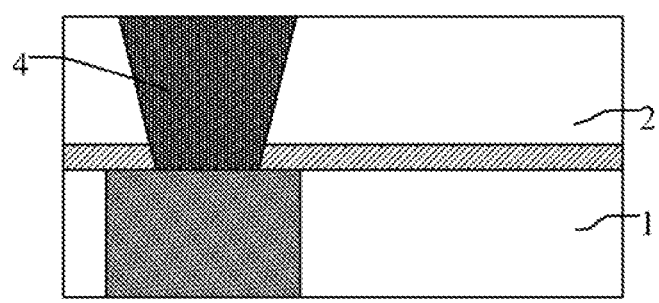

Referring to FIG. 3, a conductive plug 4 is formed in the conductive via 3.

Figure 4:
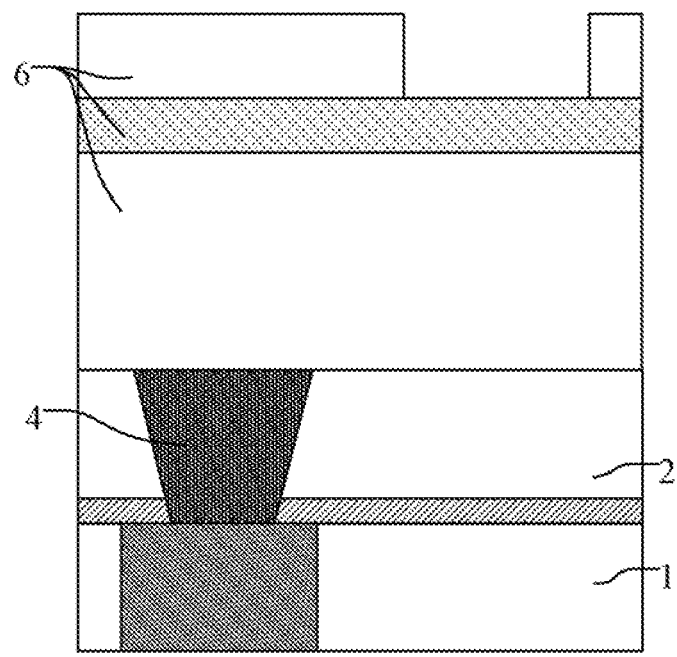
Figure 5:
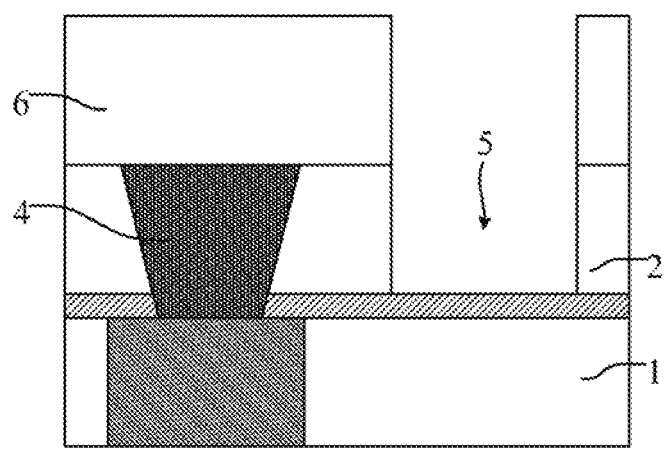
Figure 6:
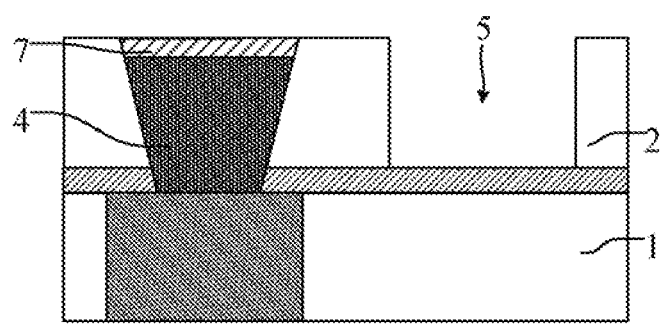

Referring to FIG. 4 to FIG. 6, an aligner trench 5 is formed in the dielectric layer 2, and the aligner trench 5 is isolated from the conductive plug 4.

Figure 7:
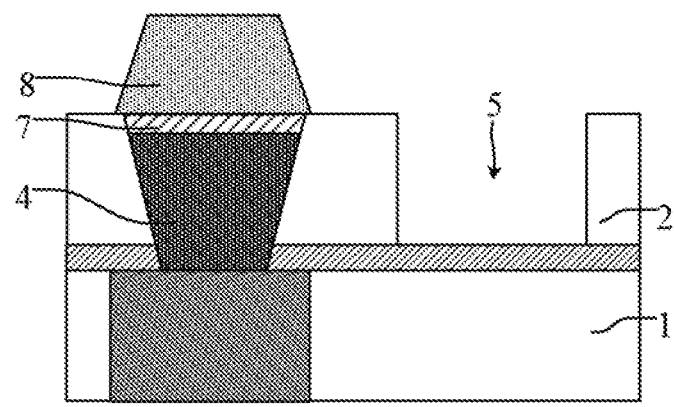

Referring to FIG. 7, a magnetic tunnel junction (MTJ) laminated structure 8 is formed on the conductive plug 4.

The inventor has found that the MTJ laminated structure 8 formed by the formation method shows relatively poor performance. Specifically, electrical contact performance of the MTJ laminated structure 8 and the conductive plug 4 is relatively poor, so that the contact resistance of the MTJ laminated structure 8 and the conductive plug 4 is relatively high, and a tunneling magnetic flux ratio (TMR) of the MTJ laminated structure 8 is reduced, thus affecting the performance of the MRAM device.

The inventor has further found through researches that reasons of the relatively poor contact performance of the MTJ laminated structure 8 and the conductive plug 4 are as follows:

The step that the aligner trench 5 is formed generally includes: as shown in FIG. 4, mask layers 6 are formed on the conductive plug 4 and the dielectric layer 2; as shown in FIG. 5, the dielectric layer 2 is etched by taking the mask layers 6 as masks to form the aligner trench 5; as shown in FIG. 6, after the aligner trench 5 is formed, the mask layers 6 are removed.

A material of the mask layers 6 is usually an organic material. The mask layers 6 are generally removed by an ashing process, the ashing process is usually performed in an oxygen-containing atmosphere. Therefore, during the removal of the mask layers 6, the conductive plug 4 is exposed in the oxygen-containing atmosphere, so that the conductive plug 4 is easily oxidized by the oxygen-containing gas, and a material of a portion of the conductive plug 4, which is in contact with the oxygen-containing gas, is converted into metal oxide 7, and the metal oxide 7 is located on a surface of the conductive plug 4. Therefore, after the MTJ laminated structure 8 is formed, the metal oxide 7 is located between the conductive plug 4 and the MTJ laminated structure 8. The MTJ laminated structure 8 may not be in direct contact with the conductive plug 4, and the metal oxide 7 is relatively high in resistivity, which causes relatively high contact resistance of the MTJ laminated structure 8 and the conductive plug 4 and reduces the contact performance of the MTJ laminated structure 8 and the conductive plug 4, thus easily reducing the TMR of an MTJ and resulting in poor performance of the formed MRAM device.

In order to address the technical problems, in some implementations of the formation method of the semiconductor structure of the present disclosure, before the aligner trench is formed, the protective layer is also formed on the conductive plug. The formation of the aligner trench generally includes a step that the dielectric layer is etched by taking the mask layers as the masks and then the mask layers are removed. The mask layers are usually removed by the oxygen-containing gas in the field of semiconductors. The protective layer formed in embodiments and implementations of the present disclosure can protect the conductive plug during the removal of the mask layers to prevent the problem of the formation of the metal oxide caused by the oxidization of the conductive plug due to exposure to the oxygen-containing gas. After the MTJ laminated structure is formed on the conductive plug, it is conducive to enabling the MTJ laminated structure to be in direct contact with the conductive plug, correspondingly conducive to reducing the contact resistance of the MTJ laminated structure and the conductive plug and improving the contact performance of the MTJ laminated structure and the conductive plug, thus favorably improving the performance of the MRAM device.

In order to make the foregoing objectives, features and advantages of embodiments and implementations of the present disclosure more comprehensible, specific embodiments and implementations of the present disclosure are described in detail with reference to the accompanying drawings.

FIG. 8 to FIG. 20 are schematic structure diagrams corresponding to various steps in one form of a formation method of a semiconductor structure according to the present disclosure.

Figure 8:
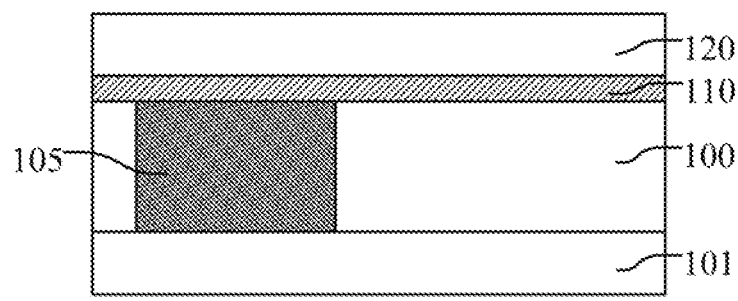
FIG. 8 to FIG. 20 are schematic structure diagrams corresponding to various steps in another form of a formation method of a semiconductor structure.

Referring to FIG. 8, a base 101 is provided.

The base 101 is configured to provide a process platform for subsequent processes.

In some implementations, the base 101 provides a process platform for formation of a magnetic random access memory (MRAM) device.

In some implementations, a transistor is formed in the base 101. The transistor may be one or two of an N-channel metal oxide semiconductor (NMOS) transistor and a P-channel metal oxide semiconductor (PMOS) transistor. Specifically, the transistor may include a gate structure and source and drain doped regions located in the base 101 at two sides of the gate structure. In some implementations, an interlayer dielectric layer and a contact hole plug running through the interlayer dielectric layer and being in contact with the source and drain doped regions are also formed in the base 101. The interlayer dielectric layer covers surfaces of the source and drain doped regions and a side wall of the gate structure. Other types of semiconductor devices may also be formed in the base 101, and functional structures such as a resistance structure and a conductive structure may also be formed in the base 101.

In some implementations, a first metal interlayer dielectric layer 100 is further formed in the base 101.

The first metal interlayer dielectric layer 100 is configured to realize electrical isolation between metal interconnection wires in a process at a subsequent stage.

In some implementations, the first metal interlayer dielectric layer 100 is located on the interlayer dielectric layer and covers the contact hole plug. In some implementations, a material of the first metal interlayer dielectric layer 100 is a low-k dielectric material (it refers to a dielectric material with a relative dielectric constant being greater than or equal to 2.6 and less than or equal to 3.9), an ultra-low-k dielectric material (it refers to a dielectric material with a relative dielectric constant being less than 2.6), silicon oxide, silicon nitride, or silicon oxynitride, and the like. Specifically, the material of the first metal interlayer dielectric layer 100 is the low-k dielectric material, which is conducive to reducing the parasitic capacitance between interconnected structures at the later stage and further reducing an RC delay at the later stage.

Correspondingly, in some implementations, an interconnection wire 105 is formed in the first metal interlayer dielectric layer 100.

The interconnection wire 105 is electrically connected with the contact hole plug, thereby realizing electrical connection of the source and drain doped regions to an external circuit or other interconnection structures and components. Specifically, the interconnection wire 105 may be any metal layer (Mx). The interconnection wire 105 may be electrically connected with the contact hole plug through an interconnection structure.

In some implementations, a material of the interconnection wire 105 is copper.

With continued reference to FIG. 8, a dielectric layer 120 is formed on the base 101.

Subsequent steps further include: a conductive plug running through the dielectric layer 120 is formed. The dielectric layer 120 is configured to realize electrical isolation between adjacent conductive plugs. The dielectric layer 120 is further configured to realize electrical isolation between the interconnection wire 105 and a subsequent magnetic tunnel junction (MTJ) laminated structure.

Specifically, the dielectric layer 120 is formed on the first metal interlayer dielectric layer 100 and covers the interconnection wire 105.

In some implementations, a material of the dielectric layer 120 is a dielectric material such as a low-k dielectric material, an ultra-low-k dielectric material, silicon oxide, silicon nitride or silicon oxynitride. In some implementations, the material of the dielectric layer 120 is silicon oxide.

In some implementations, a thickness of the dielectric layer 120 is 400 Å to 500 Å.

It should be noted that in some implementations, after the base 101 is provided and before the dielectric layer 120 is formed, the formation method of the semiconductor structure further includes that: a barrier layer 110 is formed on the base 101.

Specifically, the barrier layer 110 is located on the first metal interlayer dielectric layer 100 and covers the interconnection wire 105.

The barrier layer 110 is configured to define an etching stop position during subsequent etching of the dielectric layer 120 to form a conductive via, thereby preventing damage to the base 101 by an etching process of forming the conductive via and particularly preventing damage to the interconnection wire 105 by the etching process.

Therefore, the barrier layer 110 is made of a material having relatively high etching selectivity to the dielectric layer 120, so that the barrier layer 110 may define the etching stop position in the subsequent etching process of forming the conductive via. In some implementations, a material of the barrier layer 110 is a compound material containing one or more of carbon, nitrogen and oxygen. Specifically, in some implementations, the material of the barrier layer 110 is silicon nitride.

In other embodiments and implementations, the material of the barrier layer may also be a material such as silicon oxynitride, silicon carbide, nitride doped silicon carbide [Elaine 1] (NDC), aluminum oxide or aluminum nitride.

In some implementations, a thickness of the barrier layer 110 is 100 Å to 250 Å.

Figure 9:
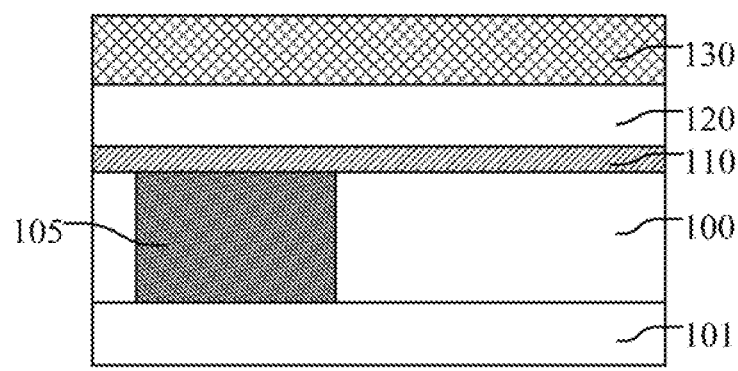

With reference to FIG. 9, it should be noted that in some implementations, after the dielectric layer 120 is formed on the base 101, the formation method of the semiconductor structure further includes that: an etching stop layer 130 is formed on the dielectric layer 120.

In a subsequent step that the conductive via running through the dielectric layer 120 is formed, the conductive via also runs through the etching stop layer 130, and then the conductive plug is formed in the conductive via. A process of forming the conductive plug usually includes a planarization step for a conductive material layer. The etching stop layer 130 formed in some implementations may define a position for planarization, which is thus conducive to reducing the process difficulty of the planarization and improving the top surface flatness and the height consistency of the conductive plug.

In addition, a protective layer is subsequently formed on the dielectric layer 120 and the conductive plug, and a subsequent step that the protective layer is removed is further included. In some implementations, by forming the etching stop layer 130, during the subsequent removal of the protective layer, the protective layer and the etching stop layer 130 have a relatively large etching selection ratio, so that the etching stop layer 130 may define the etching stop position, which is conducive to preventing damage to a top portion of the dielectric layer 120 caused by the process of removing the protective layer and improving the top surface flatness and the height consistency of the dielectric layer 120.

A material of the etching stop layer 130 may be one or more of silicon nitride, silicon oxynitride, silicon carbide and silicon oxy-carbide. The material of the etching stop layer 130 is a carbon-containing, nitrogen-containing, or carbon- and nitrogen-containing material. The carbon-containing or carbon-containing material and silicon oxide have relatively high etching selectivity, thereby contributing to ensuring that the etching stop layer 130 may define the etching stop position during the subsequent removal of the protective layer.

In some implementations, the material of the etching stop layer 130 is silicon nitride. The silicon nitride material has relatively high compactness and hardness, which is conducive to making the protective layer and the etching stop layer 130 have a relatively high etching selection ratio during the subsequent removal of the protective layer, so that the etching stop layer 130 may define the etching stop position.

In the step that the etching stop layer 130 is formed, a thickness of the etching stop layer 130 should not be too small, otherwise, the etching stop layer 130 may be removed prematurely during the subsequent planarization for forming the conductive plug. Or, if the residual etching stop layer 130 is too thin, an effect that the etching stop layer 130 defines the etching stop position in the subsequent removal of the protective layer may be reduced. The thickness of the etching stop layer 130 should not be too large, otherwise, waste of process time and process materials may be easily caused and much time would be spent in etching the etching stop layer 130 subsequently, and the process compatibility is easy to reduce. For this reason, in some implementations, the thickness of the etching stop layer 130 is 250 Å to 350 Å, such as 260 Å, 285 Å, 300 Å, 310 Å and 325 Å.

In some implementations, the etching stop layer 130 is formed by a deposition process. A process temperature of the deposition process should not be too low, otherwise, the formation quality of the etching stop layer 130 may be affected. For example, reduction of the compactness and the hardness of the etching stop layer 130 is likely to occur, and then the effect that the etching stop layer 130 defines the stop position in the subsequent planarization and the removal of the protective layer may be reduced. The process temperature of the deposition process should not be too high, otherwise, performance of the device formed in the process at a previous stage may be affected. For this reason, in some implementations, the deposition process is carried out at 500° C. to 700° C., such as 550° C., 560° C. and 670° C.

In some implementations, the etching stop layer 130 is formed using a chemical vapor deposition process. The chemical vapor deposition process is a relatively mature deposition process, which has high process compatibility and is conducive to saving the process cost.

Figure 10:
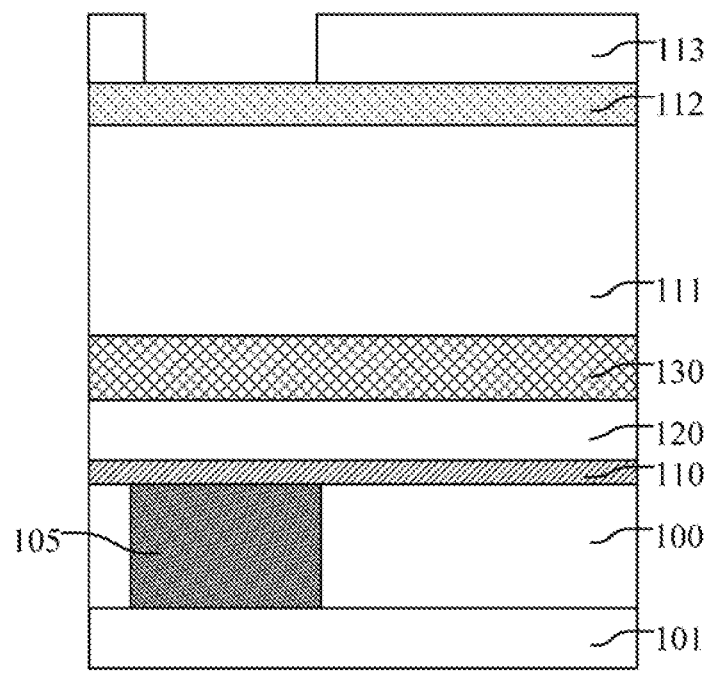
Figure 11:
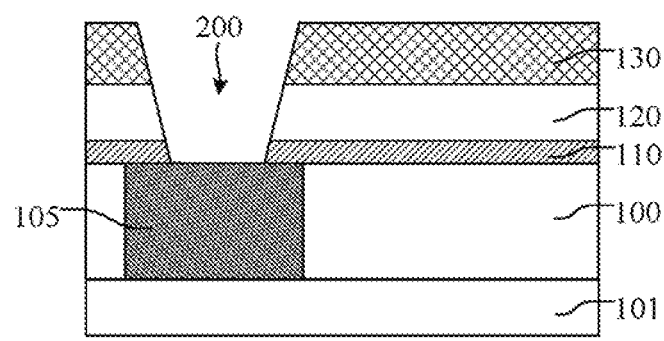

Referring to FIG. 10 to FIG. 11, a conductive via 200 (as shown in FIG. 11) running through the dielectric layer 120 is formed.

The conductive via 200 is configured to provide a space position for the subsequent formation of the conductive plug.

In some implementations, a bottom portion of the conductive via 200 exposes the interconnection wire 105, so that the conductive plug may be in contact with the interconnection wire 105 subsequently, thereby realizing electrical connection between the conductive plug and the interconnection wire 105.

In some implementations, the conductive via 200 runs through the etching stop layer 130 and the dielectric layer 120.

The specific steps that the conductive via 200 is formed in some implementations are described in detail below with reference to the drawings.

As shown in FIG. 10, a first mask layer is formed on the etching stop layer 130. The first mask layer is used as a mask for etching the etching stop layer 130 and the dielectric layer 120 to form the conductive via 200.

In some implementations, the first mask layer includes a first flat layer 111, a first anti-reflective layer 112 located on the first flat layer 111, and a first photoresist layer 113 located on the first anti-reflective layer 112. A first patterned opening (not marked) is formed in the first photoresist layer 113.

A top surface of the first flat layer 111 is a flat surface, and is configured to improve the surface flatness of the first anti-reflective coating 112, thereby improving the morphology quality and the dimensional accuracy of the first photoresist layer 113. In some implementations, a material of the first flat layer 111 is spin on carbon (SOC).

In some implementations, a thickness of the first flat layer 111 is 1300 Å to 2500 Å.

The first anti-reflective layer 112 is configured to reduce a reflection effect during exposure, thereby improving the pattern transfer accuracy, and further improving the morphology quality and the dimensional accuracy of the first photoresist layer 113. In some implementations, a material of the first anti-reflective layer 112 is a silicon anti-reflective-coating (Si-ARC).

In some implementations, a thickness of the first anti-reflective layer 112 is 300 Å to 500 Å.

In some implementations, the first photoresist layer 113 is formed by an exposure and development process.

As shown in FIG. 11, the etching stop layer 130 and the dielectric layer 120 are sequentially etched along the first patterned opening to form the conductive via 200 running through the etching stop layer 130 and the dielectric layer 120.

In some implementations, a dry etching process is adopted to sequentially etch the etching stop layer 130 and the dielectric layer 120. The dry etching process is high in etching profile controllability, which is conducive to improving the profile morphology quality of the conductive via 200.

Specifically, in the dry etching process, the etching stop layer 130 and the dielectric layer 120 may be etched sequentially in a same etching reaction chamber by changing etching gas and adjusting etching process parameters.

It should be noted that, in some implementations, during the formation of the conductive via 200, the barrier layer 110 at the bottom of the dielectric layer 120 is also etched, thereby exposing the interconnection wire 105.

In some implementations, during the formation of the conductive via 200, the first mask layer is gradually consumed, so that after the conductive via 200 is formed, the first mask layer has been removed.

Figure 12:
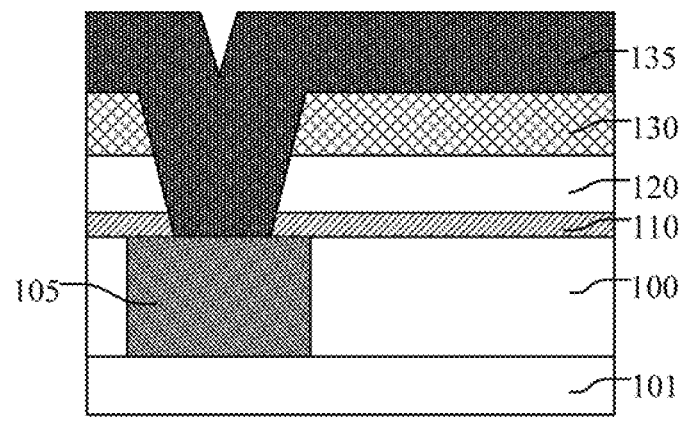
Figure 13:
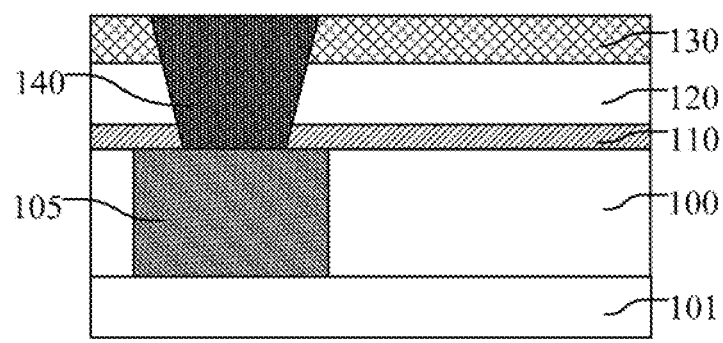

Referring to FIG. 12 to FIG. 13, a conductive plug 140 (as shown in FIG. 13) is formed in the conductive via 200.

The conductive plug 140 is configured to realize electrical connection between the base 101 and an external circuit or other interconnection structures.

Specifically, the conductive plug 140 is in contact with the interconnection wire 105, and is configured to realize electrical connection between the interconnection wire 105 and a subsequent MTJ laminated structure.

A material of the conductive plug 140 may be one or more of Cu, W, Al, TiN, TaN and Ti. In some implementations, the material of the conductive plug 140 is Cu.

In some implementations, a step that the conductive plug 140 is formed includes that:

As shown in FIG. 12, a conductive material layer 135 for filling the conductive via 200 is formed. The conductive material layer 135 also covers the etching stop layer 130. The conductive material layer 135 is configured to form the conductive plug.

As shown in FIG. 13, the etching stop layer 130 is used as a stop layer to perform planarization on the conductive material layer 135. The residual conductive material layer 135 located in the conductive via 200 is used as the conductive plug 140.

The etching stop layer 130 may be used as the stop layer during the planarization to define a planarization stop position, which not only helps to reduce the process difficulty of the planarization, but also helps to prevent damage to the top portion of the dielectric layer 120 caused by the planarization, thus improving the top surface flatness and the height consistency of the dielectric layer 120, and also improving the height consistency of the conductive plug 140. Specifically, the etching stop layer 130 is relatively high in mechanical strength and hardness, so that the planarization may be easily stopped on the etching stop layer 130.

In some implementations, the planarization is performed by using a chemical mechanical grinding process.

Figure 14:
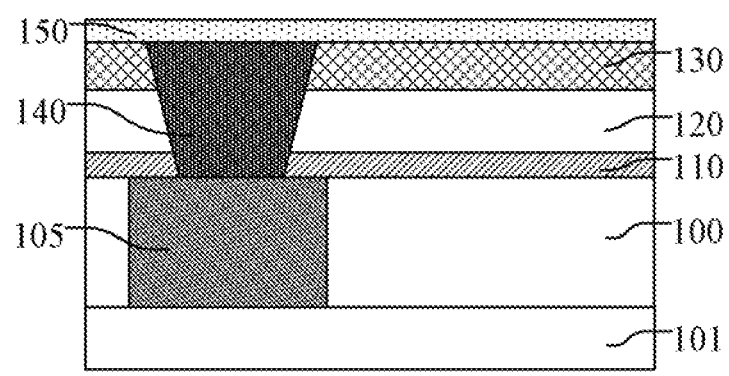

Referring to FIG. 14, a protective layer 150 is formed on the dielectric layer 120. The protective layer 150 covers the conductive plug 140.

A subsequent step further includes that: an aligner trench is formed in the protective layer 150 and the dielectric layer 120, and the aligner trench is isolated from the conductive plug 140.

In some implementations of the present disclosure, before the aligner trench is formed, the protective layer 150 is formed on the conductive plug 140. The formation of the aligner trench generally includes a step that the dielectric layer 120 is etched by taking a mask layer as a mask and then the mask layer is removed. And in the field of semiconductors, the mask layer is usually removed by oxygen-containing gas. The protective layer 150 formed in some implementations of the present disclosure may play a role of protecting the conductive plug 140 during the removal of the mask layer to prevent the problem of formation of metal oxide caused by the oxidization of the conductive plug 140 due to exposure to the oxygen-containing atmosphere. Therefore, after the MTJ laminated structure is formed on the conductive plug 140, it is conducive to enabling the MTJ laminated structure to be in direct contact with the conductive plug 140, correspondingly conducive to reducing the contact resistance of the MTJ laminated structure and the conductive plug 140 and improving the contact performance of the MTJ laminated structure and the conductive plug 140, thus improving the performance of the MRAM device.

In some implementations, the protective layer 150 is made of a material with relatively high compactness, so that the protective layer 150 may play a role of blocking the oxygen-containing gas during the subsequent removal of the mask layer to prevent the oxygen-containing gas from being in contact with the conductive plug 140, thereby protecting the conductive plug 140.

In some implementations, a material of the protective layer 150 is silicon oxide. By the use of silicon oxide, the material of the protective layer 150 is the same as that of the dielectric layer 120, which is conducive to improving the process compatibility. Moreover, silicon oxide is a material commonly used in semiconductor processes, which is conducive to improving the compatibility of the process of forming the protective layer 150 and subsequently removing the protective layer 150 and an existing process, and reducing process variations and process risk. In addition, the silicon oxide material is easy to remove, which is conducive to reducing the difficulty of the subsequent removal of the protective layer 150. Furthermore, the silicon oxide material and the material of the foregoing etching stop layer 130 have relatively high etching selectivity, which is conducive to ensuring that the subsequent removal of the protective layer 150 may be stopped on the etching stop layer 130. In other embodiments and implementations, according to an actual process and the material of the etching stop layer, the material of the protective layer may also be silicon carbide or silicon oxy-carbide.

A thickness of the protective layer 150 should not be too small, otherwise, a protection effect of the protective layer 150 on the conductive plug 140 during the subsequent removal of the mask layer may be reduced. A subsequent step that the protective layer 150 is removed is further included. The thickness of the protective layer 150 should not be too large, otherwise, the difficulty of the subsequent removal of the protective layer 150 may be increased. For this reason, in some implementations, the thickness of the protective layer 150 is 50 Å to 100 Å, such as 56 Å, 60 Å, 75 Å, 84 Å, 90 Å and 95 Å.

In some implementations, the protective layer 150 is formed by using the deposition process. The process temperature of the deposition process should not be too low, otherwise, the implementation difficulty of the deposition process may be increased, resulting in that the protective layer 150 is hard to form. The process temperature of the deposition process should not be too high, otherwise, a risk of oxidization of the conductive plug 140 may be increased and the performance of the device may be affected. For this reason, in some implementations, the process temperature of the deposition process of the protective layer 150 is 50° C. to 100° C., such as 60° C., 75° C., 80° C. and 95° C.

In some implementations, the protective layer 150 is formed by using an atomic layer deposition process. The atomic layer deposition process is a self-limiting reaction process based on atomic layer deposition. A thin film obtained by deposition may achieve a thickness of a single layer of atoms, which is conducive to improving the thickness consistency of the protective layer 150 and accurately controlling the thickness of the protective layer 150. Furthermore, the thin film prepared by the atomic layer deposition process also has the characteristics of good bonding strength, good component uniformity, good conformality and the like, which is conducive to improving the compactness of the protective layer 150, thus improving a barrier effect of the protective layer 150 on the oxygen-containing gas during the subsequent removal of the mask layer and then enhancing the protection effect of the protective layer 150 on the conductive plug 140.

Figure 15:
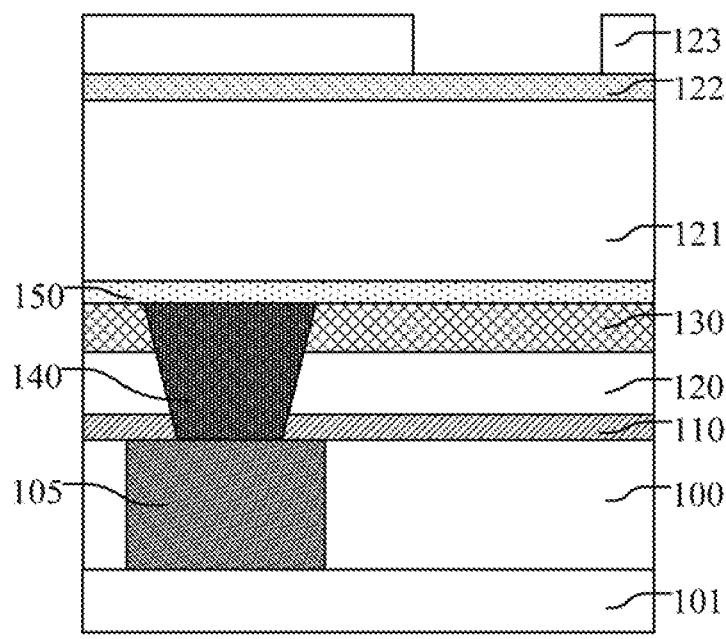
Figure 16:
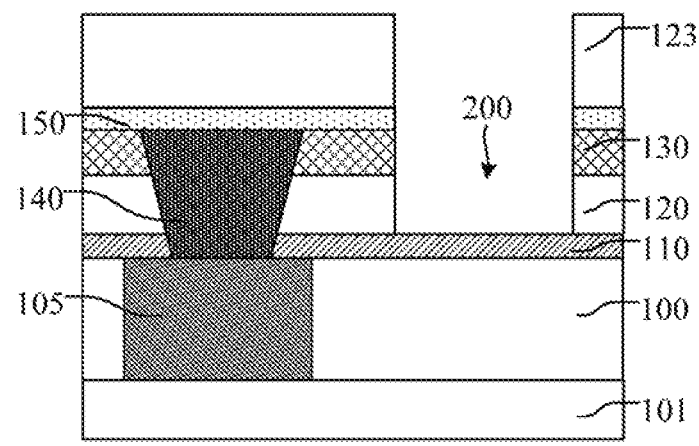
Figure 17:
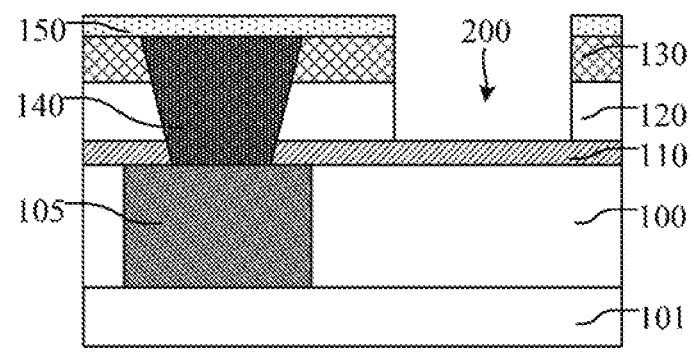

Referring to FIG. 15 to FIG. 17, an aligner trench 200 is formed in the protective layer 150 and the dielectric layer 120, and the aligner trench 200 is isolated from the conductive plug 140.

Through the formation of the aligner trench 200, after initial MTJ laminated structures are subsequently formed, the initial MTJ laminated structures formed at a bottom portion and on side walls of the aligner trench 200 are also encircled to form a groove corresponding to the aligner trench 200. The groove may be used as an aligner mark for subsequently patterning the initial MTJ laminated structures. Specifically, the subsequently formed initial MTJ laminated structures are relatively low in light transmission. After the initial MTJ structures are formed, the aligner mark (such as an aligner mark formed in the dielectric layer 120) formed in the foregoing process is covered by the initial MTJ laminated structures, so that the aligner mark is hardly used as an aligner mark for photoetching during the subsequent patterning of the initial MTJ laminated structures.

In some implementations, the aligner trench 200 is an isolation deep trench (IDT).

In order to prevent the initial MTJ laminated structures subsequently formed on the side walls of the aligner trench 200 from being in contact with each other, so as to ensure that the initial MTJ laminated structures subsequently formed in the aligner trench 200 may also be encircled to form the groove serving as the aligner mark, an opening width of the aligner trench 200 should not be too small. For this reason, in some implementations, the opening width of the aligner trench 200 is greater than or equal to 1 µm. Specifically, the opening width of the aligner trench 200 is 1 µm to 2 µm.

In order to ensure that a depth of the groove encircled by the initial MTJ laminated structures subsequently formed in the aligner trench 200 is not too small, so as to ensure that the groove may function as the aligner mark of the photolithographic process, the depth of the aligner trench 200 should not be too small. For this reason, in some implementations, the depth of the aligner trench 200 is greater than or equal to 500 Å.

Specifically, in some implementations, the depth of the aligner trench 200 is 500 Å to 1000 Å.

The step that the aligner trench 200 is formed in some implementations is described in detail below with reference to the drawings.

As shown in FIG. 15, a mask layer is formed on the protective layer 150. The mask layer covers the protective layer 150 on the conductive plug 140. In some implementations, the mask layer is a second mask layer. The second mask layer is used as an etching mask for subsequently forming the aligner trench.

The second mask layer includes a second flat layer 121 located on the protective layer 150, a second anti-reflective layer 122 located on the second flat layer 121, and a second photoresist layer 123 located on the second anti-reflective layer 122. A second patterned opening (not marked) is formed in the second photoresist layer 123, and the second patterned opening exposes a part of the second anti-reflective layer 122 located on the dielectric layer 120.

Detailed descriptions of the second flat layer 121, the second anti-reflective layer 122 and the second photoresist layer 123 may refer to the foregoing descriptions of the first flat layer 111, the first anti-reflective layer 112 and the first photoresist layer 113, and the descriptions are omitted in some implementations.

As shown in FIG. 16, the protective layer 150 and the dielectric layer 120 are etched by taking the mask layer as a mask.

In some implementations, the barrier layer 110 is used as a stop layer to etch the protective layer 150 and the dielectric layer 120, which is conducive to reducing a probability of mis-etching the first metal interlayer dielectric layer 100 during the formation of the aligner trench 200, improving the depth consistency of the aligner trench 200 and accurately controlling the depth of the aligner trench 200.

In some implementations, the etching stop layer 130 is also formed on the dielectric layer 120. Therefore, the protective layer 150, the etching stop layer 130 and the dielectric layer 120 are etched by taking the mask layer as the mask. In some implementations, the protective layer 150, the etching stop layer 130 and the dielectric layer 120 are etched by using a dry etching process.

As shown in FIG. 17, the mask layer is removed.

A material of the mask layer is an organic material. Therefore, in some implementations, the mask layer is removed by using an ashing process. Specifically, in some implementations, the mask layer is removed by using a plasma ashing process.

The ashing process is generally performed using an oxygen-containing gas. In some implementations, the protective layer 150 is formed on the conductive plug 140. The protective layer 150 may play a role of protecting the conductive plug 140 to prevent the oxygen-containing gas from being in contact with the conductive plug 140 and then prevent the problem of the formation of metal oxide caused by the oxidization of the conductive plug 140, so that a subsequent MTJ laminated structure may be in direct contact with the conductive plug 140, and the contact performance of the MTJ laminated structure and the conductive plug 140 is improved.

Figure 18:
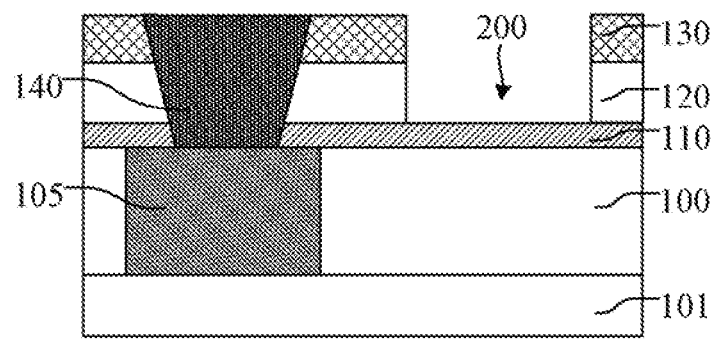

Referring to FIG. 18, after the aligner trench 200 is formed, the protective layer 150 is removed to expose a top portion of the conductive plug 140. The protective layer 150 is removed to make preparation for the subsequent formation of the MTJ laminated structure.

In some implementations, the protective layer 150 is removed by taking a top surface of the etching stop layer 130 as a stop position.

In the step that the protective layer 150 is removed, the top surface of the etching stop layer 130 may define an etching stop position, thereby preventing damage to the dielectric layer 120 caused by the process of removing the protective layer 150, which is conducive to guaranteeing the top surface flatness and the morphology quality of the dielectric layer 120 to provide a good interface for the subsequent formation of the MTJ laminated structure.

Specifically, in the step that the protective layer 150 is removed, the protective layer 150 and the etching stop layer 130 have a relatively large etching selection ratio, so that the etching stop layer 130 may define the etching stop position.

In some implementations, in the step that the protective layer 150 is removed, the etching selection ratio of the protective layer 150 and the etching stop layer 130 is greater than or equal to 10:1, such as 15:1 and 20:1.

In the step that the protective layer 150 is removed, an etching selection ratio of the protective layer 150 and the conductive plug 140 should not be too small, otherwise, damage to a top surface of the conductive plug 140 may be caused, which will reduce the interface quality of a surface of the conductive plug 140 and increase the roughness of the surface of the conductive plug 140. For this reason, in the step that the protective layer 150 is removed, the etching selection ratio of the protective layer 150 to the conductive plug 140 is greater than or equal to 10:1, such as 15:1 and 20:1.

In some implementations, the protective layer 150 is removed by a wet etching process. The wet etching process is easy to achieve a relatively large etching selection ratio. The wet etching process has simple operation steps and low process cost.

In some implementations, a material of the protective layer 150 is silicon oxide, and an etching solution for the wet etching process is a hydrofluoric acid solution. The hydrofluoric acid solution is a solution commonly used in the semiconductor process to etch silicon oxide, which is conducive to improving the process compatibility. Furthermore, the hydrofluoric acid solution has a relatively high etching selection ratio to silicon oxide and silicon nitride, which is conducive to enhancing the effect of the etching stop layer 130 configured to define the etching stop position.

In the step of the wet etching process, a volume percentage concentration of the hydrofluoric acid solution should not be too small, otherwise, an etching rate may be reduced and thus a production capacity may be reduced. The volume percentage concentration of the hydrofluoric acid solution should not be too large, otherwise, the etching stability and etching uniformity may be reduced, and thus side effects may be generated. For this reason, in some implementations, the volume percentage concentration of the hydrofluoric acid solution is 0.3% to 0.5%.

An etching time of the wet etching process should not be too short, otherwise, a risk that the protective layer 150 is not completely removed may be caused. The etching time of the wet etching process should not be too long, otherwise, a probability of damage to other film layers may be increased and the process stability is further reduced. The too long etching time may also waste the production capacity. For this reason, in some implementations, the etching time of the wet etching process is 50 seconds to 60 seconds.

In some implementations, a solution temperature of the wet etching process is 15° C. to 25° C., so as to coordinate with the volume percentage concentration of the etching solution to improve the removal efficiency of the protective layer 150, and reduce the probability of mis-etching to other film layers, which is conducive to improving the process stability and lowering the process risk.

Specifically, in some implementations, the wet etching process is performed at normal temperature.

In some implementations, 300:1 diluted HF (DHF) is used. The etching rate of the protective layer 150 is 100 Å/min to 150 Å/min, and the etching rate of the etching stop layer 130 and the conductive plug 140 is less than 10 Å/min. The etching amount of the etching stop layer 130 and the conductive plug 140 is less than 10 Å, and the lateral etching amount of the dielectric layer 120 is less than 100 Å.

Figure 19:
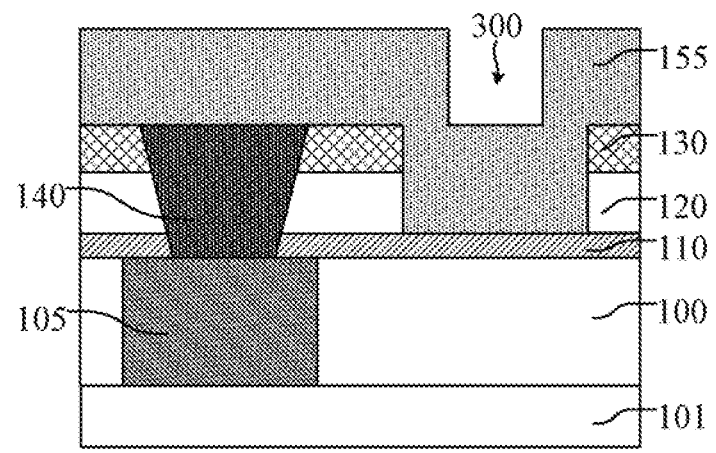
Figure 20:
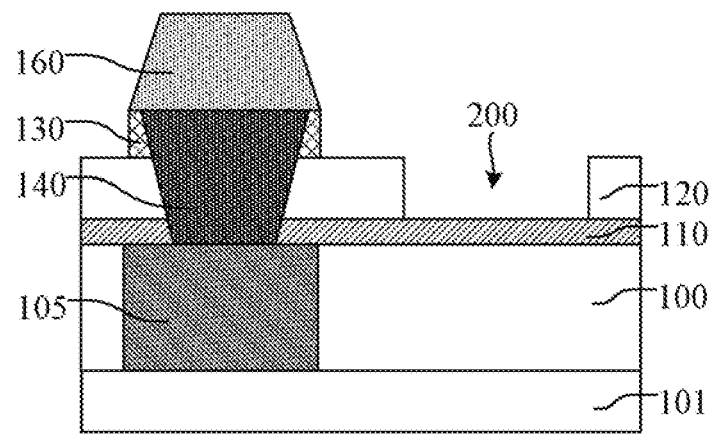

Referring to FIG. 19 to FIG. 20, after the protective layer 150 is removed, an MTJ laminated structure 160 is formed on the conductive plug 140 (as shown in FIG. 20).

The protective layer 150 formed in some implementations may play the role of protecting the conductive plug 140 during the formation of the aligner trench 200 to prevent the problem of generation of metal oxide on the surface caused by the oxidization of the conductive plug 140. Therefore, the MTJ laminated structure 160 may be in direct contact with the conductive plug 140, which is conducive to reducing the contact resistance of the conductive plug 140 and the MTJ laminated structure 160, and improving the contact performance of the conductive plug 140 and the MTJ laminated structure 160, thereby increasing the TMR of the MTJ laminated structure 160 and correspondingly improving the performance of the MRAM device.

The MTJ laminated structure 160 includes a reference layer (not shown), a tunneling layer (not shown) located on the reference layer, and a free layer (not shown) located on the tunneling layer. A magnetization direction of the reference layer is fixed, and thus may be used as a magnetization direction reference layer for the free layer. A material of the reference layer is a ferromagnetic metal material, such as CoFeB or CoFe.

The tunneling layer is configured to isolate the reference layer from the free layer. A material of the tunneling layer includes MgO, SrO, BaO, RaO, $SiO_2$, $Al_2O_3$, $HfO_2$, NiO, GdO, $Ta_2O_5$, $MoO_2$, $TiO_2$ or $WO_2$.

A magnetization direction of the free layer has two stable orientations which are parallel or opposite to the magnetization direction of the reference layer, respectively, so that the MTJ may be in a low-resistance state or a high-resistance state.

A material of the free layer is also a ferromagnetic metal material, such as CoFeB or CoFe.

The MTJ laminated structure 160 may further include an electrode layer located at a bottom portion of the reference layer. A material of the electrode layer may be one or more of tantalum nitride, tantalum, titanium and titanium nitride.

In some implementations, the step that the MTJ laminated structure 160 is formed includes that:

As shown in FIG. 19, an initial MTJ laminated structure 155 is formed on the etching stop layer 130. The initial MTJ laminated structures 155 are also formed at a bottom portion and side walls of the aligner trench 200.

The initial MTJ laminated structures 155 are configured to form the MTJ laminated structure through a subsequent patterning process.

In some implementations, after the initial MTJ laminated structures 155 are formed, the initial MTJ laminated structures 155 located in the aligner trench 200 and on the etching stop layer 130 are encircled to form a groove 300, and the groove 300 is used as an aligner mark of a photolithographic process during the subsequent patterning of the initial MTJ laminated structures 155.

As shown in FIG. 20, the initial MTJ laminated structures 155 are patterned (as shown in FIG. 19), and the residual initial MTJ laminated structure 155 located on the conductive plug 140 is maintained as the MTJ laminated structure 160.

In some implementations, the step that the initial MTJ laminated structures 155 are patterned includes that: patterned layers (not shown) are formed on the initial MTJ laminated structures 155, and partial initial MTJ laminated structures 155 are exposed from the patterned layers. The initial MTJ laminated structures 155 are etched by taking the patterned layers as masks.

In some implementations, the patterned layers include photoresist layers. The patterned layers may be formed by photolithographic processes such as photoresist coating, development and exposure. The groove 300 is used as the aligner mark to perform the exposure and development processes.

In some implementations, the initial MTJ laminated structures 155 are patterned by using the dry etching process.

In some implementations, in the step that the initial MTJ laminated structures 155 are patterned, the patterned layers are also gradually consumed. After the MTJ laminated structure 160 is formed, the patterned layers have been removed.

With continued reference to FIG. 20, after the MTJ laminated structure 160 is formed, in some implementations, the formation method of the semiconductor structure further includes that: the etching stop layer 130 exposed by the MTJ laminated structure 160 is removed.

Specifically, after the initial MTJ laminated structures 155 are patterned using the dry etching process, the etching stop layer 130 is etched in a same etching reaction chamber by changing a type of the etching gas and adjusting etching parameters.

In some implementations, the removal of the etching stop layer 130 exposed by the MTJ laminated structure 160 is described as an example. In other embodiments and implementations, the etching stop layer may also be maintained according to an actual process. In some implementations, the etching stop layer may also be used as a stop layer during the patterning of the initial MTJ laminated structures.

The present disclosure additionally provides a semiconductor structure. Referring to FIG. 17, a schematic structure diagram of one form of a semiconductor structure of the present disclosure is illustrated.

The semiconductor structure includes: a base 101; a dielectric layer 120, located on the base 101; a conductive plug 140, running through the dielectric layer 120; a protective layer 150, located on the dielectric layer 120 and covering the conductive plug 140; and an aligner trench 200, located in the dielectric layer 120 and the protective layer 150 and isolated from the conductive plug 140.

The semiconductor structure of some implementations is further provided with the protective layer 150. The protective layer 150 may play a role of protecting the conductive plug 140 during the formation of the aligner trench 200 to prevent a problem of formation of metal oxide caused by oxidization of a surface of the conductive plug 140. Therefore, a subsequent magnetic tunnel junction (MTJ) laminated structure may be in direct contact with the conductive plug 140, which is conducive to reducing the contact resistance of the MTJ laminated structure and the conductive plug 140, and improving contact performance of the MTJ laminated structure and the conductive plug 140, thereby increasing a tunneling magnetic flux ratio (MTJ) of the MTJ laminated structure and improving performance of a magnetic random access memory (MRAM) device.

The base 101 is configured to provide a process platform for processes. In some implementations, a transistor is formed in the base 101. The transistor may be one or two of an N-channel metal oxide semiconductor (NMOS) transistor and a P-channel metal oxide semiconductor (PMOS) transistor. In some implementations, an interlayer dielectric layer, and a contact hole plug running through the interlayer dielectric layer and being in contact with source and drain doped regions are also formed in the base 101. Other types of semiconductor devices may also be formed in the base 101, and functional structures such as a resistance structure and a conductive structure may also be formed in the base 101.

In some implementations, a first metal interlayer dielectric layer 100 is further formed in the base 101.

The first metal interlayer dielectric layer 100 is configured to realize electrical isolation between metal interconnection wires in a process at a later stage.

In some implementations, the first metal interlayer dielectric layer 100 is located on the interlayer dielectric layer and covers the contact hole plug. In some implementations, a material of the first metal interlayer dielectric layer 100 is a low-k dielectric material.

In some implementations, the base 101 further includes an interconnection wire 105 located in the first metal interlayer dielectric layer 100. The interconnection wire 105 is electrically connected with the contact hole plug, thereby realizing electrical connection of the source and drain doped regions and an external circuit or other interconnection structures and components. Specifically, the interconnection wire 105 may be any metal layer (Mx). The interconnection wire 105 may be electrically connected with the contact hole plug through an interconnection structure.

In some implementations, a material of the interconnection wire 105 is copper.

The dielectric layer 120 is configured to realize electrical isolation between adjacent conductive plugs 140. The dielectric layer 120 is further configured to realize electrical isolation between the interconnection wire 105 and a subsequent MTJ laminated structure.

In some implementations, the dielectric layer 120 is located on the first metal interlayer dielectric layer 100 and covers the interconnection wire 105. In some implementations, a material of the dielectric layer 120 is silicon oxide.

In some implementations, a thickness of the dielectric layer 120 is 400 Å to 500 Å.

The semiconductor structure further includes: a barrier layer 110, located between the base 101 and the dielectric layer 120. In some implementations, the barrier layer 110 is located on the first metal interlayer dielectric layer 100 and covers the interconnection wire 105.

A process of forming the conductive plug 140 generally includes a step of etching the dielectric layer 120 to form a conductive via. The barrier layer 110 is configured to define an etching stop position during the etching of the dielectric layer 120 to form the conductive via, thereby preventing damage to the base 101 caused by the etching process of forming the conductive via.

In some implementations, a material of the barrier layer 110 is silicon nitride.

In some implementations, a thickness of the barrier layer 110 is 100 Å to 250 Å.

The conductive plug 140 is configured to realize the electrical connection between the base 101 and an external circuit or other interconnection structures. Specifically, the conductive plug 140 is in contact with the interconnection wire 105, and is configured to realize electrical connection between the interconnection wire 105 and the subsequent MTJ structure. In some implementations, a material of the conductive plug 130 is Cu.

The semiconductor structure further includes: an etching stop layer 130, located between the dielectric layer 120 and the protective layer 150. The conductive plug 140 also runs through the etching stop layer 130.

A subsequent step that the protective layer 150 is removed is further included. In some implementations, through the arrangement of the etching stop layer 130, during the removal of the protective layer 150, the protective layer 150 and the etching stop layer 130 have a relatively large etching selection ratio, so that the etching stop layer 130 may define the etching stop position, which is conducive to preventing damage to a top portion of the dielectric layer 120 caused by the process of removing the protective layer 150, and improving the top surface flatness and the height consistency of the dielectric layer 120, thereby providing a flat surface and a good interface for the subsequent formation of the MTJ laminated structure.

In addition, the formation of the conductive plug 140 generally includes a step of performing planarization on a conductive material layer. The etching stop layer 130 may also be used as a stop layer configured to define a stop position for the planarization, thus reducing the process difficulty of the planarization, and improving the top surface flatness and the height consistency of the conductive plug 140, thereby providing a flat surface and a good interface for the subsequent formation of the MTJ laminated structure.

A material of the etching stop layer 130 may be one or more of silicon nitride, silicon oxynitride, silicon carbide and silicon oxy-carbide. The material of the etching stop layer 130 is a carbon-containing, nitrogen-containing, or carbon and nitrogen-containing material. The carbon-containing or carbon-containing material and silicon oxide have relatively high etching selectivity, thereby contributing to ensuring that the etching stop layer 130 may define the etching stop position during the subsequent removal of the protective layer 150.

In some implementations, the material of the etching stop layer 130 is silicon nitride. The silicon nitride material is relatively high in compactness and hardness. In some implementations, a thickness of the etching stop layer 130 is 250 Å to 350 Å, such as 260 Å, 285 Å, 300 Å, 310 Å and 325 Å.

The protective layer 150 is configured to protect the conductive plug 140 during the formation of the aligner trench 200.

Specifically, the formation of the aligner trench 200 generally includes a step of removing a mask layer by using oxygen-containing gas. The protective layer 150 may play a role of isolating the conductive plug 140 from the oxygen-containing gas during the removal of the mask layer to prevent the problem of the formation of the metal oxide caused by oxidization due to the exposure of the conductive plug 140 to the oxygen-containing gas. Therefore, the subsequent MTJ laminated structure may be in direct contact with the conductive plug 140, which is conducive to improving the contact performance of the MTJ and the conductive plug 140.

In some implementations, a material of the protective layer 150 is silicon oxide, which is conducive to improving the compatibility of the process, and reducing process variations and process risk. In addition, the silicon oxide material is easy to remove, which is conducive to reducing the difficulty of the subsequent removal of the protective layer 150. Furthermore, the silicon oxide material and the material of the foregoing etching stop layer 130 have relatively high etching selectivity, which is conducive to ensuring that the removal of the protective layer 150 may be stopped on the etching stop layer 130. In other embodiments and implementations, the material of the protective layer may also be silicon carbide or silicon oxy-carbide.

A thickness of the protective layer 150 should not be too small or too large. If the thickness of the protective layer 150 is too small, the protection effect of the protective layer 150 on the conductive plug 140 in the step of the removal of the mask layer during the formation of the aligner trench 200 may be reduced. A subsequent step that the protective layer 150 is removed is further included. If the thickness of the protective layer 150 is too large, the difficulty of the subsequent removal of the protective layer 150 may be increased. For this reason, in some implementations, the thickness of the protective layer is 50 Å to 100 Å, such as 56 Å, 60 Å, 75 Å, 84 Å, 90 Å and 95 Å.

Through the arrangement of the aligner trench 200 in the semiconductor structure, after initial MTJ laminated structures are subsequently formed, the initial MTJ laminated structures formed at the bottom portion and on the side walls of the aligner trench 200 are also encircled to form a groove corresponding to the aligner trench 200. The groove is used as an aligner mark for subsequently patterning the initial MTJ laminated structures.

In some implementations, the aligner trench 200 is an isolation deep trench (IDT). In some implementations, the aligner trench 200 is located in the dielectric layer 120, the protective layer 150 and the etching stop layer 130.

In some implementations, an opening width of the aligner trench 200 is 1 μm to 2 μm.

In some implementations, a depth of the aligner trench 200 is 500 Å to 1000 Å.

The semiconductor structure may be formed by forms of the formation method described above, and may also be formed by other formation methods. The specific descriptions of the semiconductor structure of the present implementations may refer to the corresponding descriptions in the foregoing implementations, and the descriptions are omitted in the present implementations.

Although embodiments and implementations of the present disclosure are described above, the present disclosure is not limited thereto. A person skilled in the art may make variations and modifications without departing from the spirit and scope of the present disclosure. Therefore, the protective scope of the present disclosure should be subject to the claims.

What is claimed is:

1. A formation method of a semiconductor structure, comprising:
   providing a base;
   forming a dielectric layer on the base;
   after forming the dielectric layer on the base, forming an etching stop layer on the dielectric layer;
   after forming the etching stop layer on the dielectric layer, forming a conductive via running through the dielectric layer and the etching stop layer;
   forming a conductive plug in the conductive via;
   forming a protective layer on the dielectric layer, wherein the protective layer covers the conductive plug;
   forming an aligner trench in the protective layer and the dielectric layer, wherein the aligner trench is isolated from the conductive plug;
   after forming the aligner trench, removing the protective layer to expose a top portion of the conductive plug, wherein the protective layer is removed by taking a top surface of the etching stop layer as a stop position;
   after removing the protective layer, forming a MTJ laminated structure on the conductive plug; and
   after forming the MTJ laminated structure, removing the etching stop layer exposed by the MTJ laminated structure.

2. The formation method of the semiconductor structure according to claim 1, wherein the step of forming the conductive plug comprises:
   forming a conductive material layer filling the conductive via, wherein the conductive material layer further covers the etching stop layer;
   performing planarization on the conductive material layer by taking the etching stop layer as a stop layer; and
   taking residual conductive material layer located in the conductive via as the conductive plug.

3. The formation method of the semiconductor structure according to claim 1, wherein a process of forming the protective layer comprises an atomic layer deposition process.

4. The formation method of the semiconductor structure according to claim 1, wherein the protective layer is formed using a deposition process, and a process temperature of the deposition process is 50° C. to 100° C.

5. The formation method of the semiconductor structure according to claim 1, wherein a material of the protective layer comprises silicon oxide, silicon carbide or silicon oxy-carbide.

6. The formation method of the semiconductor structure according to claim 1, wherein the protective layer is removed using a wet etching process.

7. The formation method of the semiconductor structure according to claim 6, wherein:
   an etching solution of the wet etching process is a hydrofluoric acid solution, and
   process parameters of the wet etching process comprises: a volume percentage concentration of the hydrofluoric acid solution is 0.3% to 0.5%, a solution temperature is 15° C. to 25° C., and an etching time is 50 seconds to 60 seconds.

8. The formation method of the semiconductor structure according to claim 1, wherein in the step of removing the protective layer, an etching selection ratio of the protective layer to the conductive plug is greater than or equal to 10:1.

9. The formation method of the semiconductor structure according to claim 1, wherein in the step of forming the protective layer, a thickness of the protective layer is 50 Å to 100 Å.

10. The formation method of the semiconductor structure according to claim 1, wherein in the step of removing the protective layer, an etching selection ratio of the protective layer to the etching stop layer is greater than or equal to 10:1.

11. The formation method of the semiconductor structure according to claim 1, wherein the etching stop layer is formed using a chemical vapor deposition process.

12. The formation method of the semiconductor structure according to claim 1, wherein:
   the etching stop layer is formed using a deposition process, and
   a process temperature of the deposition process is 500° C. to 700° C.

13. The formation method of the semiconductor structure according to claim 1, wherein a material of the etching stop layer comprises at least one of silicon nitride, silicon oxynitride, silicon carbide or silicon oxy-carbide.

14. The formation method of the semiconductor structure according to claim 1, wherein in the step of forming the etching stop layer, a thickness of the etching stop layer is 250 Å to 350 Å.

* * * * *